United States Patent
Yang et al.

(10) Patent No.: US 6,410,462 B1
(45) Date of Patent: Jun. 25, 2002

(54) METHOD OF MAKING LOW-K CARBON DOPED SILICON OXIDE

(75) Inventors: Hongning Yang, Vancouver, WA (US); David Russell Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/569,861

(22) Filed: May 12, 2000

(51) Int. Cl.⁷ .......................... H01L 21/31; H01L 23/58
(52) U.S. Cl. ................... 438/788; 438/778; 438/787; 438/789; 438/780; 438/790; 257/642; 257/635; 257/640
(58) Field of Search ................. 438/778, 788, 438/789, 780, 790; 257/642, 635, 640

(56) References Cited

U.S. PATENT DOCUMENTS

| | | | | |
|---|---|---|---|---|
| 4,717,585 A | * | 1/1988 | Ishihara et al. | 427/39 |
| 6,068,884 A | * | 5/2000 | Rose et al. | 427/255.6 |
| 6,245,690 B1 | * | 6/2001 | Yau et al. | 438/790 |
| 6,287,990 B1 | * | 11/2001 | Cheung et al. | 438/780 |
| 6,303,523 B2 | * | 12/2001 | Cheung et al. | 438/780 |
| 6,348,725 B2 | * | 2/2002 | Cheung et al. | 257/642 |

OTHER PUBLICATIONS

Paper presented by M.J. Loboda at the Advanced Metalization Symp., 09–99 entitled, "Applications for Organosilicon Gases in PECVD Processes for Low–k Dielectrics" consisting of 7 pages.

Paper presented by Wai–Fan Yau, Yung–Cheung Lu, Kuo-wei Liu, Nasreen Chopra, Tze Poon, Ralf Willecke, Ju–Hyung Lee, et al., at the Advanced Metalization Symp., 09–99 entitled, "Black Diamond™—A Low k Dielectric for Cu Damascene Applications", consisting of 5 pages.

Paper presented by Rye et al., at the Advanced Metalization Symp. 09–99 entitled "Characterization of Nanoporous Low–k CVD Film for ULSI Interconnection", consisting of 1 page.

Article entitled "Low Dielectric Constant SiCOH Films as Potential Candidates for Interconnect Dielectrics", by Grill, et al., published in Mat. Res. Soc. Symp. Proc. vol. 565, 1999, pp. 107–116.

Paper presented by A. Grill at SEMICON West, SEMI 1999, Low K. Dielectric Materials Technology entitled "Pecvd Prepared Low–K Films", pp. E–1–E–16.

Paper presented by D. Cheung at SEMICON West, SEMI 1999, Low K Dielectric Materials Technology entitled, "Black Diamond CVD Low–K Films for Copper Damascene", pp. F–1–F–10.

* cited by examiner

*Primary Examiner*—Caridad Everhart
*Assistant Examiner*—V. Yevsikov
(74) *Attorney, Agent, or Firm*—Matthew D. Rabdau; David C. Ripma; Scott C. Krieger

(57) ABSTRACT

A method of producing a low-k interconnect dielectric material, using PECVD processes and readily available precursors to produce carbon-doped silicon oxide (SiOC). SiOC dielectric materials are produced using conventional silane based gas precursors, of silane and nitrous oxide, along with hydrocarbon gas. The use of methane and acetylene in combination with silane based gas precursors is provided. Methane produces network terminating species, specifically methyl, which replaces oxygen in an Si—O bond within a silicon dioxide network. This increases the volume, reduces the density and the dielectric constant of the material. Acetylene acts as a possible source of carbon and as a modifier, reducing or eliminating undesirable bridging species, such as carbene, or enhancing desireable network terminating species, such as methyl. Following implantation, the material is annealed to reduce the—OH and to potentially further lower the dielectric constant.

30 Claims, 1 Drawing Sheet

METHOD OF MAKING LOW-K CARBON DOPED SILICON OXIDE

BACKGROUND OF THE INVENTION

This invention relates generally to a method of forming a dielectric of the type used in integrated circuits, and more particularly to a plasma enhanced chemical vapor deposition method of forming a low-dielectric-constant insulating material.

The designers and makers of large scale integrated circuits continue to make ever-smaller devices, which allow for greater speed and increased device packing densities. Sizes of individual features (e.g. the transistor gate length) on ultra-large-scale-integration (ULSI) circuits is shrinking to less than 200 nanometers (nm). The resultant increase in packing densities on a semiconductor chip, and the associated increase in functionality, has greatly increased the number and density of interconnects on each chip.

Smaller on-chip devices, packed closer together, with increased functionality and complexity, require interconnects (lines, vias, etc.) which are smaller, more complex (e.g. more wiring levels), and more closely spaced. The smaller sizes of the interconnects, which increases resistance, and closer interconnect spacing, which increases capacitance, produces RC (resistance-capacitance) coupling problems including propagation delays, and cross talk noise between interlevel and intralevel conductors. As interconnect lines, both interlevel and intralevel, become smaller and more closely spaced, RC delays become an increasing part of total signal delays, offsetting much of the speed advantage derived from smaller device size. RC delays thus limit improvement in device performance. Small conductor size increases the resistivity (R) of metal lines and smaller interline and interlevel spacing increases the capacitance (C) between lines. Use and development of lower-resisitivity metals such as copper continue to reduce the resistivity of interconnect lines. However, it is also important to reduce the capacitance.

Since capacitance (C) is directly proportional to the dielectric constant (k) of the interconnect dielectric, capacitance can be reduced by employing lower dielectric constant (low-k) materials. Lowering the capacitance (C) helps to reduce the problems associated with RC coupling in ULSI circuits. What the industry is looking for is a suitable replacement for silicon dioxide ($SiO_2$), which has long been used as a dielectric in integrated circuits. Silicon dioxide has excellent thermal stability and relatively good dielectric properties, having a dielectric constant of around 4.0. But there is now a need for an interconnect dielectric material which is suitable for use in integrated circuit interconnects and which has a lower dielectric constant than $SiO_2$.

After a long search for possible low-k materials to be used as interconnect dielectrics in ULSI circuits, the candidates have been narrowed down to a few, depending upon the application. One of the promising materials is carbon-doped, or carbonaceous, silicon oxide (SiOC).

Carbonaceous silicon oxide has been successfully deposited by chemical vapor deposition (CVD) using methylsilane based precursors, such as trimethylsilane or tetramethylsilane. Methylsilane based SiOC materials have dielectric constants of between approximately 2.5 and 3.1. However, methylsilane based precursors are organosilicon compounds that are extremely volatile and flammable. They are also expensive. These various drawbacks make the use of methylsilane based precursors less than ideal for the processing of integrated circuit devices.

It would be advantageous to have a method of forming SiOC without the use of methylsilane based precursors.

It would be advantageous to have a method of forming SiOC using readily available precursor materials and equipment.

SUMMARY OF THE INVENTION

Accordingly, a method of forming an interconnect dielectric material for a semiconductor device is provided. The method comprises the steps of:

a) positioning a substrate within a plasma enhanced chemical vapor deposition (PECVD) chamber; and b) introducing a source of silicon, a source of oxygen, and a source of carbon into the deposition chamber under sufficient applied energy to form plasmas of silicon containing free radicals, oxygen containing free radicals, and carbon containing free radicals, whereby silicon, oxygen, and carbon are available to form a carbonaceous silicon oxide (SiOC) film. In a preferred embodiment of the present invention, the source of silicon is silane, the source of oxygen is nitrous oxide or oxygen, and the source of carbon is methane, acetylene or both. These precursors are readily available and produce materials with dielectric constants of less than four (4.0). In a preferred embodiment using both methane and acetylene, the method produces materials with dielectric constants of less than three (3.0).

Materials with lower density and lower dielectric constants are produced by introducing more network terminating species and reducing the number of bridging species. The reduction in dielectric constant can be achieved by doping methyl ($—CH_3$) groups into an $SiO_2$ network to form SiOC, where some Si—O bonds are replaced by Si—$CH_3$ bonds.

Carbonaceous silicon oxide (SiOC) refers herein to a material comprising silicon oxygen and carbon, additional materials may be present and may even be desirable, especially hydrogen, which forms the desirable methyl group. For instance in a preferred embodiment of the present method, an interconnect dielectric material is produced with the carbon component being provided by a methyl group ($—CH_3$), to form a structure akin to $H_3C—SiO_3$.

In a preferred embodiment of the present invention, methane and acetylene are both introduced into the plasma chamber. The plasma energy within the chamber converts methane into methyl ($—CH_3$), which is a network terminating free radical, or species, and carbene ($—CH_2—$), which is a bridging free radical, or species. Species herein refers to the free radical while it remains free within the plasma and also once it has bonded when forming the material. Since structures with network terminating species ($—CH_3$), such as:

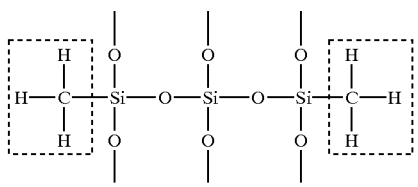

produce lower density and lower dielectric constant materials, they are preferred. Structures incorporating bridging species, which tend to form undesirable amorphous silicon carbide type linkages, such as:

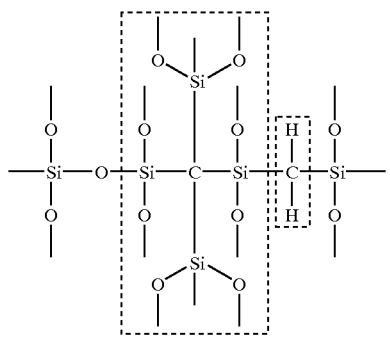

will preferably be reduced or eliminated.

In another preferred embodiment of the method of the present invention, gas precursors are introduced into the plasma chamber. These gas precursors include a silicon precursor, preferably silane, an oxygen precursor, preferably nitrous oxide, a network terminating precursor, preferably methane, and a modifier precursor, preferably acetylene. While both methane and acetylene contain carbon and act as a possible source of carbon, the combination is preferred. The methane provides a network terminating free radical, methyl (—$CH_3$), along with a less desirable bridging free radical, carbene (—$CH_2$—). The presence of a modifier precursor, in this case acetylene, either enhances production of network terminating species or reduces the undesirable species, which allows a larger portion of methyl to replace Si—O bonds producing lower-k materials.

Following the processing within the plasma chamber the substrate is annealed to condition the film by reducing —OH, as well.

DETAILED DESCRIPTION OF THE INVENTION

The present invention provides a method of depositing carbonaceous silicon oxide (SiOC) on a silicon wafer, or other substrate. The wafer has been prepared by using well known techniques to form integrated circuit (IC) features (e.g. transistors and other active and passive devices) on the wafer. The type and number of integrated circuit features on the wafer are unimportant to the process of the present invention, except that low-k SiOC is most advantageously employed on ultra-large-scale-integrated (ULSI) devices. The form, architecture, and conductive materials used in the interconnect structures, as well as the methods of forming such structures, are not described herein and are a matter of design choice well known to those skilled in the art. This invention relates to the method of forming suitable low-dielectric-constant (low-k) dielectric films, which are deposited on the wafer and are suitable for use between and around the conductive lines, vias, and other conductors in IC devices.

Figure 1:
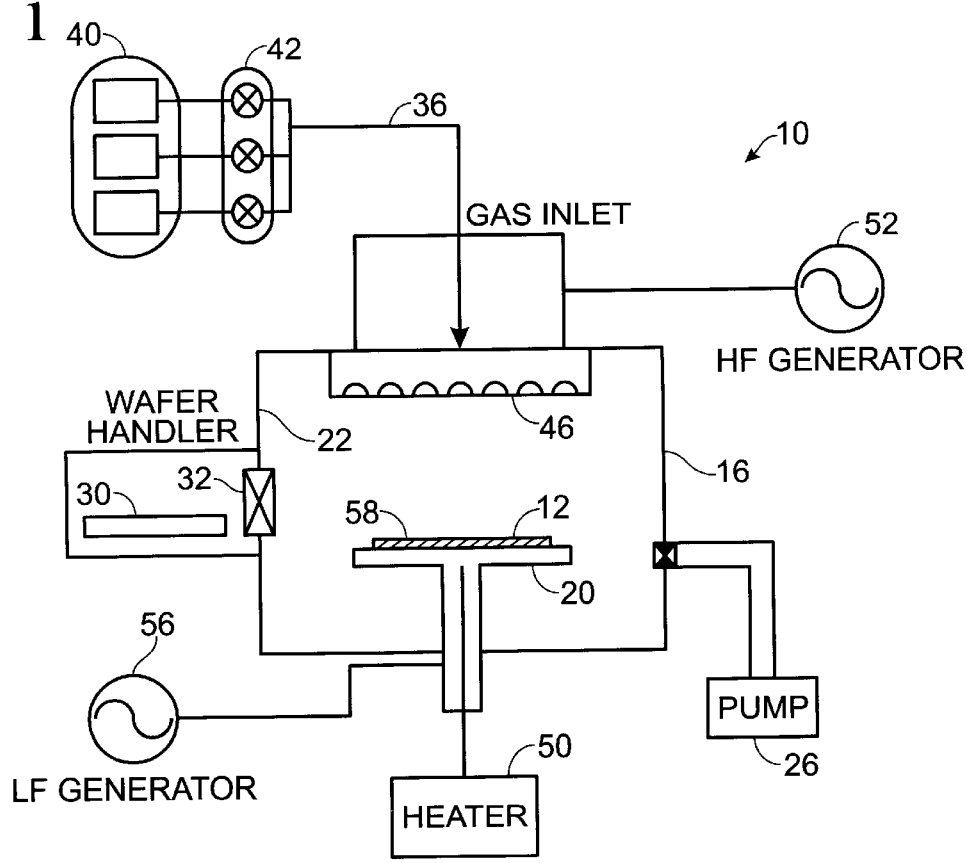
FIG. 1 is a schematic depiction of a PECVD chamber for carrying out selected steps in the process of the present invention.

FIG. 1 is a schematic illustration of a suitable apparatus 10 for carrying out a plasma enhanced chemical vapor deposition (PECVD) process on a substrate, such as a wafer 12. Apparatus 10 includes a PECVD chamber 16 of a size suitable for holding one or more wafers 12, which are supported in chamber 16 on a chuck 20. As is typical of such chambers, an interior 22 can be evacuated or pressurized as desired by a suitable pump and valve apparatus, which is schematically illustrated in FIG. 1 by pump 26. Individual wafers 12 are moved in and out of chamber 16 by a suitable wafer handler 30 through a gate valve 32 in a wall of chamber 16 and onto or off of chuck 20.

Selected gases used in PECVD processing are introduced into the chamber through a suitable manifold system 36 from various gas supply reservoirs indicated collectively at 40, controlled by valves 42. Although for purposes of illustration only three supply reservoirs are shown, as many reservoirs as are necessary will be used. In a preferred embodiment of the present invention at least four gases are used, so that up to four supply reservoirs are used. It is also possible to combine one or more of the precursor gases into a single supply reservoir prior to introduction into chamber 16. The gases are introduced into chamber 16 through what is commonly referred to as a shower head 46, which distributes the gases. Chuck 20 can be heated to a desired temperature, a heating element 50 is shown schematically. Heating element 50 and chuck 20 are used together to select the temperature of wafer 12 during PECVD processing.

Plasma energy is supplied to chamber 16 through a radio frequency (RF) generator 52 which supplies high frequency (HF) RF power radiated through shower head 46. The industry standard for HF plasma energy in PECVD chambers is 13.56 megahertz (MHz), although the invention is not limited to any specific high frequency value. Apparatus 10 also includes a low frequency (LF) generator 56 for supplying LF power to the interior of chamber 16. LF power is applied between chuck 16 and shower head 46 in a manner well known to those of ordinary skill in the art. Although LF power is available, it is not necessary to the present invention.

Figure 2:
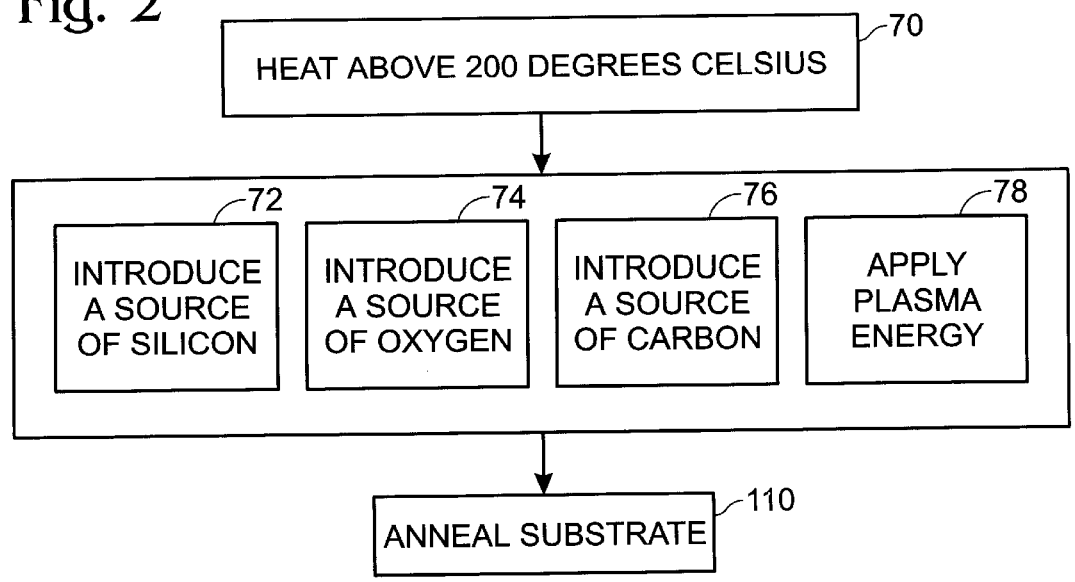
FIG. 2 is a block diagram illustrating the steps in the method for depositing SiOC on a substrate in a chamber as shown in FIG. 1, in accordance with the present invention.

FIG. 2 illustrates the steps of the method of the present invention, which will be described with reference to FIGS. 1 and 2. A wafer 12 is prepared, and then positioned on chuck 20 in PECVD chamber 16 by wafer handler 30. Wafer 12 is typically a silicon wafer prepared Ad with any desired circuit structures and ready for additional processing according to the method of the present invention. Wafer 12 has an upper surface 58 for receiving the low-k material. The first step in FIG. 2 is step 70, which is the heating of wafer 12 to a temperature above 200 ° C. In a preferred embodiment of the present invention, wafer 12 is heated to a temperature generally in the range of 200 ° C.–300 ° C., preferably 250 ° C.

Step 72 is the introduction of a source of silicon, preferably silane ($SiH_4$), into chamber 16 via manifold 36 from suitable supplies 40.

Step 74 is the introduction of a source of oxygen, preferably nitrous oxide ($N_2O$) or oxygen, into chamber 16 via manifold 36 from suitable supplies 40.

Step 76 is the introduction of a source of carbon. The source of carbon preferably provides a methyl group (—$CH_3$) within the plasma. In a preferred embodiment of the present invention, acetylene ($C_2H_2$), methane ($CH_4$) or preferably a combination of both are used as the source of carbon.

As is apparent from steps 72, 74, and 76 the sources of silicon, oxygen and carbon are preferably from separate sources. These separate sources are generally more readily available and less expensive than more complicated organosilicon precursors.

During steps 72, 74, and 76 suitable plasma power is applied in chamber 16 as illustrated by step 78. As known to those of skill in the art of PECVD processing, the plasma energy in chamber 16 ionizes the introduced gases, generating polymer radicals that are deposited on surface 58 of wafer 12. In the present invention, suitable plasma power includes HF energy (13.86 MHz), at an energy level of between 0.5 watts and 3 watts per square centimeter of substrate surface (i.e. the surface area of upper surface 58).

In a preferred method of the present invention, the carbon source (step 76) includes a network terminating precursor and a modifier precursor. As used herein, "network terminating precursor" refers to a precursor that produces at least one network terminating free radical or species within the PECVD chamber. For example, in a preferred embodiment the network terminating precursor is methane ($CH_4$), which produces a methyl free radical (—$CH_3$). Once the methyl free radical is bonded to a silicon atom, it is network terminating in that no additional bond can be made to the terminating hydrogen atoms surrounding the carbon atom.

It would be quite straight forward if methane, for example, only produced network terminating free radicals of methyl. Unfortunately, methane within the PECVD chamber also produces carbene (—$CH_2$—). Carbene has two free bonds which allows the carbon atom to bond to two atoms within the dielectric material. Free radicals, or species, that allow for additional bonds to the carbon atom are referred to herein as unsaturated (or "bridging") free radicals, or species. In addition hydrogen is commonly removed from carbene during processing. This removal of hydrogen allows the carbon atom to be bonded to four silicon atoms forming the undesirable silicon carbide type structure.

In a preferred embodiment of the present invention, a modifier precursor is introduced into the PECVD chamber to reduce or eliminate bridging free radicals, or species. A modifier precursor is a precursor that reacts within the plasma either to reduce, or eliminate, unwanted free radicals, or species, or to enhance, or increase, desirable free radicals, or species. The modifier species is preferably an alkyne (a molecule having a triple bonded carbon atom), such as acetylene. The acetylene chemistry increases the proportion of methyl, or other saturated species, either by enhancing production of saturated species or by reducing carbene and other unsaturated species. This results in more efficient incorporation of methyl into the formation of SiOC as compared to the formation of amorphous silicon carbide type structures. The incorporation of methyl produces structures akin to Si—$CH_3$ instead of Si—C—Si type structures. The presence of the methyl structure within the SiOC contributes directly to a lower dielectric constant, even though the film remains essentially solid. Although acetylene is preferred, it is not absolutely necessary to the method of the present invention. An alkene (a molecule having a double bonded carbon atom), such as ethylene may also be used. It is also possible to practice the present invention without any modifier precursor.

The reactions in the PECVD chamber are summarized as follows:

Plasma Polymerization Chemistry

Precursor: ($SiH_4$ +$N_2O$)+($C_2H_2$ +$CH_4$)
Free radicals produced by plasma discharge:
Silane ($SiH_4$) is introduced into chamber 16 per step 72. Plasma energy is applied per step 78 producing a silicon containing free radicals, silyl, and atomic hydrogen.

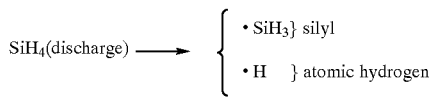

Nitrous oxide ($N_2O$) is introduced into chamber 16 per step 74. Plasma energy is applied per step 78 producing nitric oxide and atomic oxygen, along with atomic nitrogen.

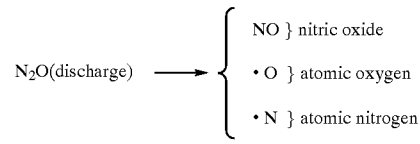

Methane ($CH_4$) is introduced into chamber 16 per step 76. Plasma energy is applied per step 78 producing a carbon containing free radical, preferably methyl. A less desirable carbon containing free radical carbene, which acts as a bridging free radical, is also produced, along with atomic hydrogen.

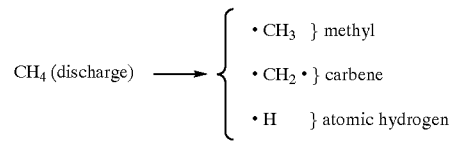

Acetylene ($C_2H_2$) is introduced into chamber 16 per step 76. Plasma energy is applied per step 78 producing additional carbon containing free radicals. In addition to providing another possible source of carbon, the acetylene, and its radicals (i.e. carbyne), will act as a modifier within the plasma to enhance methyl, or reduce carbene.

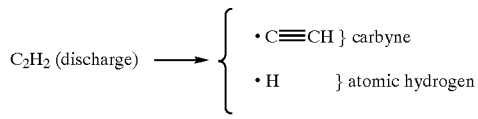

In a preferred embodiment of the method of the present invention, the proportion of silane, nitrous oxide, methane and acetylene introduced into chamber 16 is selected to deposit carbonaceous silicon oxide (SiOC) on wafer 12 by plasma enhanced chemical vapor deposition (PECVD). The selected proportion of methane to acetylene is between approximately 5:1 and 1:5, preferably 1:1.

The carbonaceous silicon oxide deposited on wafer 12, according to the method of the present invention, has a lower dielectric constant than silicon dioxide. In a preferred embodiment, the SiOC has a dielectric constant comparable to that provided by using methylsilane precursors, but using more readily available and less expensive precursors.

Finally, wafer 12 is removed from chamber 16 by any suitable means, such as handler 30, and annealed (step 110) in a suitable annealing oven at a temperature generally in the range of 300° C. to 500° C., and preferably 400° C., for one to five hours. In an alternative embodiment of the present invention, the anneal step can be eliminated if the deposition is done at a temperature greater than approximately 400° C. This may reduce the costs associated with the present method.

The following is a specific experimental example of the method of the present invention:

EXAMPLE

In an Oxford plasma lab 100 PECVD system chamber, a six inch wafer 12 was placed on chuck 20 and heated to a temperature of 250° C. A flow of $SiH_4$, $N_2O$, $CH_4$, and $C_2H_2$ gases is introduced into chamber 16 to provide a ratio of $SiH_4:N_2O:CH_4:C_2H_2$ of approximately 15:30:50:20. HF power (13.56 MHz) is applied at a power level of 50 watts. The ambient pressure in the chamber is maintained at approximately 0.4 Torr.

The above conditions produce a deposition of SiOC of approximately 370 angstroms per minute. Deposition continues for sufficient time to deposit a desired thickness of material. The interconnect dielectric material produced using the conditions above has a dielectric constant of approximately 2.85, which is well below the 4.1 of silicon dioxide.

Following processing within chamber 16, the wafer 12 is annealed at a temperature of 400 degrees Celsius for 2 hours.

Using acetylene, instead of acetylene and methane, provides a deposition rate of 770 angstroms per minute of a interconnect dielectric with a dielectric constant of 3.4. Using only methane, instead of acetylene and methane, provides a deposition rate of 220 angstroms per minute of an interconnect dielectric with a dielectric constant of 3.45. While both of these alternatives produce SiOC materials with a dielectric constant lower than $SiO_2$, the SiOC material deposited above with a dielectric constant of 2.85 is preferred.

Although methane is used above as the network terminating precursor. Other network terminating precursors may be used. Preferably the network terminating precursors will be saturated hydrocarbons. Or example, in another embodiment of the present invention, the network terminating precursor is propane. Propane will produce propyl within the plasma along with less desirable free radicals. Due to the added complexity of propane, many additional free radicals will be formed. This will require one or more modifier precursors to adequately reduce or eliminate any bridging free radicals, or species, that are present.

Although acetylene is the preferred modifier precursor, other modifier precursors are within the scope of the present invention.

Additional alternative embodiments are possible within the scope of the present invention. The invention can be practiced using different precursor materials. Other variations of the method within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of forming a low dielectric constant carbonaceous silicon oxide on a substrate for use in interconnect structures of integrated circuits comprising the steps of:
    a) positioning a substrate within a plasma enhanced chemical vapor deposition (PECVD) chamber;
    b) introducing a source of silicon, a source of oxygen, and a source of carbon into the plasma enhanced chemical vapor deposition (PECVD) chamber containing the substrate;
    c) applying sufficient energy within the plasma enhanced chemical vapor deposition (PECVD) chamber to form plasmas of silicon containing free radicals, oxygen containing free radicals, and carbon containing free radicals within the plasma enhanced chemical vapor deposition (PECVD) chamber; and
    d) forming the low dielectric constant carbonaceous silicon oxide on the substrate within the deposition chamber, wherein the low dielectric constant carbonaceous silicon oxide has a dielectric constant of less than 4.

2. The method of claim 1, wherein the substrate is heated to a temperature above 200 degrees Celsius (°C).

3. The method of claim 1, wherein the substrate is heated to a temperature in the range of about 200° C. to about 300° C.

4. The method of claim 1, wherein the substrate is heated to a temperature of about 250° C.

5. The method of claim 1, wherein the source of silicon comprises silane ($SiH_4$).

6. The method of claim 1, wherein the source of oxygen comprises nitrous oxide ($N_2O$).

7. The method of claim 1, wherein the source of carbon comprises acetylene ($C_2H_2$).

8. The method of claim 1, wherein the source of carbon comprises methane ($CH_4$).

9. The method of claim 1, wherein the source of carbon comprises acetylene ($C_2H_2$) and methane ($CH_4$).

10. A method of forming a low dielectric constant carbonaceous silicon oxide on a substrate for use in interconnect structures of integrated circuits comprising the steps of:
    a) positioning the substrate in a plasma enhanced chemical vapor deposition (PECVD) chamber and heating the substrate to a temperature above 200 degrees Celsius;
    b) introducing a silicon precursor, an oxygen precursor, a network terminating precursor, and a modifier precursor into the plasma enhanced chemical vapor deposition (PECVD) chamber containing the substrate; and
    c) applying sufficient energy to form a plasma within the plasma enhanced chemical vapor deposition (PECVD) chamber containing the substrate, the plasma comprising silicon free radicals, oxygenfree radicals, network terminating free radicals, and modifier free radicals, whereby silicon, oxygen and carbon comprising plasmas are present to form a carbonaceous silicon oxide (SiOC) film comprising a network terminating species, wherein the carbonaceous silicon oxide film has a dielectric constant of less than 3.

11. The method of claim 10, wherein the silicon precursor is silane.

12. The method of claim 10, wherein the oxygen precursor is nitrous oxide, or oxygen.

13. The method of claim 10, wherein the network terminating precursor is a saturated hydrocarbon.

14. The method of claim 13, wherein the saturated hydrocarbon produces methyl free radicals.

15. The method of claim 13, wherein the saturated hydrocarbon is methane.

16. The method of claim 13, wherein the saturated hydrocarbon produces propyl free radicals.

17. The method of claim 13, wherein the saturated hydrocarbon is propane.

18. The method of claim 10, wherein the modifier precursor is an alkyne.

19. The method of claim 18, wherein the alkyne is acetylene.

20. The method of claim 10, wherein the modifier precursor is an alkene.

21. The method of claim 20, wherein the alkene is ethylene.

22. A method of forming a low dielectric constant carbonaceous silicon oxide on a substrate for use in interconnect structures of integrated circuits comprising the steps of:

a) positioning the substrate in a plasma enhanced chemical vapor deposition (PECVD) chamber and heating the substrate to a temperature above 200 degrees Celsius;

b) introducing silane, nitrous oxide, methane, and acetylene into the plasma enhanced chemical vapor deposition (PECVD) chamber containing the substrate and applying sufficient energy within the plasma enhanced chemical vapor deposition (PECVD) chamber to form a plasma containing silicon, oxygen, network terminating free radicals, bridging free radicals and modifier free radicals within the plasma enhanced chemical vapor deposition (PECVD) chamber containing the substrate, whereby the modifier free radicals react with and reduce the bridging free radicals, leaving network terminating free radicals to react to form a desired carbonaceous silicon oxide having a dielectric constant of less than 3; and c) annealing the substrate.

23. The method of claim 22, wherein methane and acetylene are introduced at a ratio of between 5 to 1 and 1 to 5.

24. The method of claim 22, wherein methane and acetylene are introduced at a ratio of 5 to 2.

25. The method of claim 22, wherein methane and acetylene are introduced at a ratio of 1 to 1.

26. A method of forming a low dielectric constant carbonaceous silicon oxide on a substrate for use in interconnect structures of integrated circuits comprising the steps of:

a) positioning the substrate in a plasma enhanced chemical vapor deposition (PECVD) chamber and heating the substrate to a temperature above 200 degrees Celsius;

b) introducing precursors consisting essentially of silane, an oxygen precursor consisting of nitrous oxide or oxygen; a network terminating precursor selected from the group consisting of methane and propane, and a modifier precursor selected from the group consisting of acetylene and ethylene, into the plasma enhanced chemical vapor deposition (PECVD) chamber containing the substrate;

c) applying sufficient energy within the plasma enhanced chemical vapor deposition (PECVD) chamber containing the substrate to form a plasma containing silicon, oxygen, network terminating free radical, bridging free radicals and modifier free radicals within the plasma enhanced chemical vapor deposition (PECVD) chamber, whereby the modifier free radicals react with and reduce the bridging free radicals, leaving network terminating free radicals to react to form a desired carbonaceous silicon oxide having a dielectric constant of less than 3; and d) annealing the substrate.

27. A method of forming a low dielectric constant carbonaceous silicon oxide on a substrate for use in interconnect structures of integrated circuits comprising the steps of:

a) positioning the substrate in a plasma enhanced chemical vapor deposition (PECVD) chamber and heating the substrate to a temperature above 200 degrees Celsius;

b) introducing precursors consisting essentially of silane, nitrous oxide; methane, and acetylene, into the plasma enhanced chemical vapor deposition (PECVD) chamber containing the substrate;

c) applying sufficient energy within the plasma enhanced chemical vapor deposition (PECVD) chamber to form a plasma containing silicon, oxygen, network terminating free radical, bridging free radicals and modifier free radicals within the plasma enhanced chemical vapor deposition (PECVD) chamber containing the substrate, whereby the modifier free radicals react with and reduce the bridging free radicals, leaving network terminating free radicals to react to form a desired carbonaceous silicon oxide having a dielectric constant of less than 3; and d) annealing the substrate.

28. The method of claim 27, wherein methane and acetylene are introduced at a ratio of between 5 to 1 and 1 to 5.

29. The method of claim 27, wherein methane and acetylene are introduced at a ratio of 5 to 2.

30. The method of claim 27, wherein methane and acetylene are introduced at a ratio of 1 to 1.

* * * * *